United States Patent [19]

Winter

[11] 4,000,014
[45] Dec. 28, 1976

[54] PROCESS FOR PRODUCING DUCTILE SUPERCONDUCTIVE ALLOYS

[75] Inventor: Heinrich Winter, Eschborn, Taunus, Germany

[73] Assignee: Battelle-Institut e.V., Frankfurt am Main, Germany

[22] Filed: Sept. 18, 1974

[21] Appl. No.: 507,072

[30] Foreign Application Priority Data

Sept. 21, 1973 Germany ............... 2347507

[52] U.S. Cl. ............... 148/11.5 R; 29/599; 264/12; 264/13
[51] Int. Cl.$^2$ ............... H01L 39/24
[58] Field of Search ............... 148/11.5 R; 29/599; 264/5, 6, 8, 12, 13, 14; 75/.5 B, .5 C

[56] References Cited

UNITED STATES PATENTS

| | | | |
|---|---|---|---|
| 3,196,532 | 7/1965 | Swartz et al. | 29/420 |
| 3,472,705 | 10/1969 | Gregory | 148/11.5 |
| 3,713,898 | 1/1973 | Giorgi | 29/599 |
| 3,748,728 | 7/1973 | Watson | 29/599 |

*Primary Examiner*—W. Stallard
*Attorney, Agent, or Firm*—Christen & Sabol

[57] ABSTRACT

A process for incorporating a superconductive compound or compounds by fusion in a base metal having good electrical and heat conductive properties, such as copper, silver, aluminum, and the like. The process involves preparing a melt of the base metal and of the alloy components which combine to form the superconductive compound or compounds having a $\beta$-W (A 15) structure. Then the melt is solidified at a cooling rate of at least 1000° C./sec. whereby a ductile superconductive alloy is formed wherein the individual particles of the superconductive compounds are finely distributed in the base metal and are mutually spaced with respect to each other in such a way that the critical value for the tunnel effect is not exceeded.

12 Claims, No Drawings

PROCESS FOR PRODUCING DUCTILE SUPERCONDUCTIVE ALLOYS

BACKGROUND OF THIS INVENTION

1. Field of this Invention

This invention relates to a process for producing ductile, superconductive alloys by incorporating one or more superconductive compounds by fusion in a base metal having good electrical and heat conductive properties; for example, copper, silver, aluminum, or the like. In the process of this invention, the individual particles of the superconductive compound or compounds are finely distributed in the base metal and are mutually spaced apart in such a way that the critical value for the tunnel effect is not exceeded.

2. Prior Art

A process for producing ductile, inherently stable, superconductive wires is already known wherein the starting materials consist of alloys on a copper or aluminum base with superconductive intermetallic compounds, such a niobium and tin, incorporated therein by fusion (see Germal Patent 2,116,260). In this known process, elongated deposits, for example, of the intermetallic compound $Nb_3Sn$ are obtained by directional solidification. The alloy which is produced in this way can be processed by wire drawing porcesses, inter alia, to form superconductive wires. In the course thereof, it is essential that the spaces between the extended precipitates are minimized to such an extent by the deformation process that they can be superconductively bridged by the tunnel effect.

C. C. Tsuei, Science, vol. 180 Apr. 6, 1973), pp. 57–58, describes a very similar process. Similarly, according to Tsuei, superconductive properties can only be obtained with cast alloys of composition corresponding to those cited in the above-mentioned German patent (alloys on the quasi binary section Cu-$Nb_3Sn$) if the solidified alloys are extended by means of rollers and/or the wire drawing process and the incorporated particles of superconductive compounds are drawn sufficiently closely together for the particle spacing dictated by the tunnel effect to be attained or not exceeded. In addition, the annealing treatment indicated in Tsuei, which is carried out for 5 hours at 800° C., does not raise the superconductivity of these alloys in the unworked state to in excess of 5° K.

However, on account of the directional solidifcation in particular, the known processes are subject to the disadvantage of only being suitable for producing cast elements of relatively small dimensions which are, in fact, too small for many applications. In addition, these known processes are practically limited to the production of thin wires or wire-like structures as the superconductive alloys can only be produced by rolling and wiredrawing processes in which the incorporated particles of superconductive compounds are arranged parallel to each other and drawn sufficiently closely together (parallel flow lines) for the mutual spacing to be bridged by the tunnel effect.

The workability of thin wires and of other products produced by the known processes is therefore very limited as it is necessary to insure, during the subsequent working processes, that the tunnel effect which is decisive for superconductivity is maintained and that the flow lines will continue to run parallel to each other, that is, even after further working.

BROAD DESCRIPTION OF THIS INVENTION

An object of this invention is to eliminate the above disadvantages of the known processes and to disclose a method of producing supercodnductive alloys which can be further worked in an economic manner to form molded elements of desired shape and dimensions. Thus, what is required is a process for producing a ductile alloy having largely isotropic properties, that is, directionally independent mechanical and electrical properties.

Other objects and advantages of this invention are set forth herein and are obvious to one ordinarily skilled in the art in view of the specification and claims.

It has been found that an alloy of this type can be produced in a simple and inexpensive manner by means of the process of this invention.

This process involves a process for incorporating a superconductive compound or compounds by fusion in a base metal having good electrical and heat conductive properties, such as copper, silver, aluminum, and gold. The process includes preparing a melt of the base metal and of the alloy components which combine to form the superconductive compound or compounds having a $\beta$ - W (A 15) structure. The melt is solidified at a cooling rate of at least 1000° C./sec. A ductile superconductive alloy is formed, wherein the individual particles of the superconductive compounds are finely distributed in the base metal and are mutallly spaced with respect to each other in such a way that the critical value for the tunnel effect is not exceeded.

The following elements constitute suitable alloy components which combine to form superconductive compounds with $\beta$ - W (A 15) structure: niobium or vanadium and tin, aluminum, silicon, gallium, or germanium.

Preferably the melt is caused to solidify at a cooling speed of $5 \times 10^4$ to $1 \times 10^{6°}$ C./sec.

More narrowly, the process of this invention can utilize a base metal which is copper and components forming the superconductive compounds which are 1 to 12 percent by weight niobium and 0.5 to 5 percent by weight tin or 0.2 to 3 percent by weight aluminum and/or germanium. Or, the process, more narrowly, can utilize a base metal which is copper and components forming the superconductive compounds which are 0.5 to 9 percent by weight vanadium and 0.2 to 3 percent by weight silicon, germanium, aluminum, or gallium.

For example, the rapid solidification of the melt can be carried out (i) by a method known as granulation, (ii) spraying of droplets of the melt, (iii) by centrifugal action onto cooling surfaces, (iv) by spraying, or (v) by melt spinning, and then the solidified alloy particles are worked to form molded bodies. Also, for example the rapid solidification of the melt is achieved by forcing the melt out of cooled nozzles or by the roll casting process.

This invention also includes the alloys produced according to the process of this invention.

DETAILED DESCRIPTION OF THIS INVENTION

This invention thus departs from the premise that to produce a superconductive compound having the desired properties, the structural composition thereof must be improved in such a way that an extended form and parallel arrangement of the incorporated superconductive compounds is no longer necessary. This invention also proceeds from the observation that extremely rapid solidification of the alloy melts or cooling rates above the given limit value enable a sufficiently fine distribution of the superconductive compounds to be obtained in the base metal. As a result of the high cooling speed, instead of a few large precipitates, a plurality of small precipitates spaced substantially closer together are produced. If the solidification rate of the alloy melt (for instance, in the Cu-Nb-Sn system on the quasibinary section Cu-Nb$_3$Sn) is raised to a specific value (in the case of this system it is estimated at about 5,000° C./sec.) the spacing between the minute, finely distributed, superconductive precipitates in the copper matrix falls below the critical value for the tunnel effect. The alloy produced in this way is superconductive and electrically and mechanically isotropic without having to subject it to further treatment to draw the precipitated particles closer together.

To obtain these high cooling rates it is necessary to divide the melt into small particles which then solidify very rapidly either in free fall or after falling on cooling surfaces. When modern granulating processes are employed, large quantities of a uniform round or flake-form granulate are obtained in a very short time. this can then be pressed to form large billets or plugs from which sectional pieces of an istropic superconductive material are obtained on a large scale by means of extrusion processes.

The superconductive alloys produced according to this invention are extremely ductile; they can be worked at high levels of deformability without impairing their electrical and mechanical properties, for example, by means of extrusion processes to form hollow sections. With the alloy produced according to this invention, it is also very simple to obtain superconductive connections for example, by friction welding or by electron beam welding.

In addition, in comparison with the alloys produced by the known processes, substantially smaller quantities of superconductive alloy components are required to obtain comparable superconductivity. This is a considerable economic advantage because these sueperconductive alloy components are extremely costly in relation to the base material.

It is also possible with the process according to this invention to convert to the superconductive state alloy components which are quite different from the compositions which have hitherto had superconductive properties. Thus, new superconductive alloy systems can be produced. Alloys in the Cu-V-Al system become superconductive on the Cu-V$_3$Al section if the solidification speed of the melt exceeds $10^{5°}$ C./sec.

According to this invention it is also possible to considerably improve the transition temperature, critical current density, and critical magnetic field of the known alloys having a slower solidification rate.

The preferred embodiment of this invention is represented by Example 2.

Other features, advantages, and applications of this invention will be made apparent from the following description of various alloys produced in the normal way and by the process according to this invention:

EXAMPLE 1

An alloy of the quasi binary section Cu-Nb$_3$Sn having the following composition: Cu-5 percent by weight Nb-2 percent by weight Sn - remainder impurities up to 0.3 percent by weight, is not superconductive in the normal, cast, non-heat treated state. After directional solidification under argon in an upright graphite crucible having an inner diameter of 5 mm which was lowered in a water-cooled quartz tube through an inductively produced heating zone where the temperature gradient was approximately 600° C./cm and the fusion zone approximately 2 cm in length, the solidified samples were approximately 10 cm in length and about 5 mm in diameter. In this state, they possessed a transition temperature of about 7° K and after processing to form wires having a diameter of 0.5 mm this rose to 14° K. This represents the prior art.

The same alloy was then finely divided into small droplets by means of a rotating centrifugal siphon from graphite in an argon atmosphere. The particles solidified at a solidification rate of about $10^{4°}$ C./sec. to form a granulate having an average grain diameter of about 0.5 mm. The apparatus had a throughput capacity of 1.2 to /hr. The granulate was then subjected to a reduction annealing process, compacted to form extrusion press plugs having a diameter of 15 cm and subsequently extruded to form tubes having an outer diameter of 20 mm and a wall thickness of 2mm. In a tension test carried out at room temperature, elongation of the tubular material was 17 percent and in the cold state it could be bent with a curvature radius of 25 cm. The ends of the tube could be superconductively electron beam welded when curved inwards or outwards at a sharp angle and inserted one in the other. The connections and the tubular material were helium-tight. These tubes could be used as heavy current conductors which could be charged with a current intensity of $10^6$A/cm$^2$ and could also be used for the transportation of liquid helium. The transition temperature was found to be 17° K. This represents this invention.

EXAMPLE 2

An alloy on the quasi binary section Cu-Nb$_3$Al having the following composition: Cu- 5.5 percent by weight Nb—0.6 percent by weight Al — remainder impurities up to 0.3 percent by weight, is not superconductive in the normal, cast, non-heat treated state. This represents the prior art.

This alloy was then finely divided into droplets using a rotating centrifugal siphon from graphite in an argon temperature. The particles came to rest at a sharp angle on cooled metal sheets and there solidified to form elongated flake-shaped particles having a thickness of about 50$\mu$m with a solidification rate of about $10^{6°}$ C./sec. These particles where then compacted to form extrusion press plugs having a diameter of 6 cm and subsequently extruded to form rods having a diameter of 10 mm. The rods were then worked by means of circular hammers and wire drawing to form wires having a diameter of 1 mm. After a soft annealing operation under protective gas (2 hours at 620° to 770° C.), in the tension test at room temperature the material possessed an elongation of 12 percent. The transition temperature was found to be 16.7°K. Cooled with liquid helium, the wires could be charged with 3 × $10^6$ A/cm$^2$. This represents this invention.

EXAMPLE 3

An alloy having the following composition: Au — 7.6 percent by weight V — 1.4 percent by weight Si — remainder impurities up to 0.3 percent by weight, was sprayed with argon. The solidified particles were generally spherical in shape and had an average diameter of 15 $\mu$m. The granulate was compacted to form an extrusion press plug having a diameter of 3 cm, sheathed with a gold sheet, evacuated and extrusion pressed to form 5 mm rods. These were drawn to form wires having a diameter of 0.5 mm and soft annealed under protective gas at a temperature of 500° to 700° C. for 2 hours. The transition temperature of this wire was 18.4° K. and was thus above the transition temperature for $V_3Si$ which was 17.0° K. Cooled with liquid helium, the wires could be charged with $4 \times 10^7$ A/cm² without loosing their superconductivity.

Thus the process according to this invention makes it possible to produce superconductive alloys which far surpass the known alloys on account of their high ductility and isotropic mechanical and electrical properties, which are less costly to produce and, in particular, require smaller quantities of superconductive compounds as compared with known alloys used for the same purposes.

What is claimed is:

1. A process for incorporating a supercondcutive compound or compounds by fusion in a base metal having good electrical and heat conductive properties, which is selected from the group consisting of copper, silver, aluminum, gold, and alloys formed from said base metals, which comprises (a) preparing a melt of the base metal and of the alloy components which combine to form the superconductive compound or compounds having a β-W (A-15) structure, and (b) solidifying the melt at a cooling rate of at least 1,000° C./sec., whereby a ductile superconductive alloy is formed wherein the individual particles of the superconductive compounds are finely distributed in the base metal and are mutually spaced with respect to each other in such a way that the critical value for the tunnel effect is not exceeded.

2. A process as described in claim 1 wherein the melt is caused to solidify at a cooling speed of $5 \times 10^4$ to $1 \times 10^{6°}$ C./sec.

3. A process as described in claim 1 wherein the base metal consists of copper and the components forming the superconductive compounds consist of 1 to 12 percent by weight niobium and 0.5 to 5 percent by weight tin or 0.2 to 3 percent by weight aluminum and/or germanium.

4. A process as described in claim 1 wherein the base metal consists of copper and the components forming the superconductive compounds consist of 0.5 to 9 percent by weight vanadium and 0.2 to 3 percent by weight silicon, germanium, aluminum, or gallium.

5. An alloy produced according to the process of claim 1.

6. A process as described in claim 1 wherein rapid solidification of the melt is carried out by the granulating process which involves (i) centrifuging droplets by centrifugal force, (ii) impinging of droplets of the melt onto cool supports, (iii) atomizing of the melt by means of compressed gas or with a liquid being under pressure or (iv) the melt spinning process, by the roll casting process or by forcing the melt out of cooled nozzles, and then the solidified alloy particles are worked for form molded bodies.

7. A process as described in claim 1 wherein the rapid solidification of the melt is achieved by forcing the melt out of nozzles into a cooling environment or by rolling the melt with cooled rolls directly into thin plates.

8. A process as described in claim 1 wherein said base metal is copper.

9. A process as described in claim 1 wherein said base metal is silver.

10. A process as described in claim 1 wherein said base metal is aluminum.

11. A process as described in claim 1 wherein said base metal is selected from the group consisting of copper, silver, gold and aluminum, and wherein said solidification of said step (b) is achieved by forcing said melt through a nozzle into a cooling medium.

12. a process as described in claim 1, wherein said base metal is gold.

* * * * *